(12) United States Patent
Higashitani

(10) Patent No.: US 7,286,408 B1
(45) Date of Patent: Oct. 23, 2007

(54) BOOSTING METHODS FOR NAND FLASH MEMORY

(75) Inventor: Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/381,874

(22) Filed: May 5, 2006

(51) Int. Cl.
G11C 16/06 (2006.01)

(52) U.S. Cl. .............................. 365/185.19; 365/185.18

(58) Field of Classification Search ............ 365/185.02
See application file for complete search history.

(56) References Cited

U.S. PATENT DOCUMENTS

| | | | |
|---|---|---|---|
| 5,043,940 A | 8/1991 | Harari | |
| 5,172,338 A | 12/1992 | Mehrotra et al. | |
| 5,570,315 A | 10/1996 | Tanaka et al. | |
| 5,621,684 A * | 4/1997 | Jung ..................... | 365/185.17 |
| 5,677,873 A | 10/1997 | Choi et al. | |
| 5,715,194 A | 2/1998 | Hu | |
| 5,774,397 A | 6/1998 | Endoh et al. | |
| 5,793,677 A | 8/1998 | Hu et al. | |
| 5,887,145 A | 3/1999 | Harari et al. | |
| 5,969,985 A | 10/1999 | Tanaka et al. | |
| 5,991,202 A | 11/1999 | Derhacobian et al. | |
| 6,044,013 A | 3/2000 | Tanaka et al. | |
| 6,046,935 A | 4/2000 | Takeuchi et al. | |
| 6,061,270 A | 5/2000 | Choi | |
| 6,107,658 A | 8/2000 | Itoh et al. | |
| 6,154,391 A | 11/2000 | Takeuchi et al. | |
| 6,282,117 B1 | 8/2001 | Tanaka et al. | |
| 6,363,010 B2 | 3/2002 | Tanaka et al. | |
| 6,455,889 B2 | 9/2002 | Sakui | |
| 6,456,528 B1 | 9/2002 | Chen | |
| 6,493,265 B2 | 12/2002 | Satoh et al. | |
| 6,512,262 B2 | 1/2003 | Watanabe | |
| 6,522,580 B2 | 2/2003 | Chen et al. | |
| 6,525,964 B2 | 2/2003 | Tanaka et al. | |
| 6,545,909 B2 | 4/2003 | Tanaka et al. | |
| 6,614,688 B2 | 9/2003 | Jeong et al. | |
| 6,643,188 B2 | 11/2003 | Tanaka et al. | |
| 6,717,838 B2 | 4/2004 | Hosoi | |
| 6,717,861 B2 | 4/2004 | Jeong et al. | |
| 6,859,394 B2 | 2/2005 | Matsunaga et al. | |
| 6,859,395 B2 | 2/2005 | Matsunaga et al. | |
| 6,859,397 B2 | 2/2005 | Lutze et al. | |
| 6,898,126 B1 | 5/2005 | Yang et al. | |
| 6,930,921 B2 | 8/2005 | Matsunaga et al. | |
| 7,099,193 B2 * | 8/2006 | Futatsuyama .......... | 365/185.17 |
| 7,212,435 B2 * | 5/2007 | Rudeck et al. ......... | 365/185.02 |

(Continued)

FOREIGN PATENT DOCUMENTS

JP    2006-313613    * 11/2006

OTHER PUBLICATIONS

Copending U.S. Appl. No. 11/381,865, filed May 5, 2006.*

(Continued)

*Primary Examiner*—Tan T. Nguyen
(74) *Attorney, Agent, or Firm*—Winston & Strawn LLP

(57) ABSTRACT

A floating gate memory array includes row control circuits that provide a programming voltage to a selected word line and provide a stair-like pattern of boosting voltages to unselected word lines. Boosting voltages descend with increased distance from the selected word line. Boosting voltages are increased in small increments up to their final values.

11 Claims, 12 Drawing Sheets

U.S. PATENT DOCUMENTS

2005/0047210 A1    3/2005  Matsunaga et al.
2005/0174852 A1    8/2005  Hemink
2005/0226055 A1   10/2005  Guterman
2006/0092703 A1    5/2006  Chae et al.
2006/0133149 A1    6/2006  Chae et al.
2006/0198222 A1*   9/2006  Rudeck et al. .............. 365/206

OTHER PUBLICATIONS

Aritome et al., "Reliability Issues of Flash Memory Cells", Proceedings of the IEEE, New York, vol. 81, No. 5, May 1, 1993, pp. 776-788.

Brown et al., Editors, "Nonvolatile Semiconductor Memory Technology, A Comprehensive Guide to Understanding and Using NVSM Devices", IEEE Press Series on Microelectronic Systems, (1998), 57 pages.

Cho et al., "A Dual Mode NAND Flash Memory: 1-Gb Multilevel and High-Performance 512-Mb Single-Level Modes", IEEE Journal of Solid-State Circuits, vol. 36, No. 11, Nov. 2001, 9 pages.

Choi et al., "A Novel Booster Plate Technology in High Density NAND Flash Memories for Voltage Scaling Down and Zero Program Disturbance", 1996 Symposium on VLSI Technology Digest of Technical Papers, 0-7803-3342-X/96/IEEE, 4 pages.

Jung et al., "A 3.3V 128Mb Multi-Level NAND Flash Memory for Mass Storage Applications", Samsung Electronics Co., Ltd., Kheung, Korea, 1 page, Feb. 1996.

Jung et al., "A 3.3-V Single Power Supply 16-Mb Nonvolatile Virtual DRAM Using a NAND Flash Memory Technology", IEEE Journal of Solid-State Circuits, vol. 32, No. 11, Nov. 1997, 12 pages.

Jung et al., "A 117-mm$^2$ 3.3-V Only 128-Mb Multilevel NAND Flash Memory for Mass Storage Applications," IEEE Journal of Solid-State Circuits, vol. 31, No. 11, Nov. 1996, 10 pages.

Kim et al., "Fast Parallel Programming of Multi-Level NAND Flash Memory Cells Using the Booster-Line Technology", Symposium on VLSI Technology Digest of Technical Papers, (1997), 2 pages.

Nozaki et al., "A 1-Mb EEPROM with MONOS Memory Cell for Semiconductor Disk Application", IEEE Journal of Solid-State Circuits, vol. 26, No. 4, Apr. 1991, 5 pages.

Satoh et al., "A Novel Gate-Offset NAND Cell (GOC-NAND) Technology Suitable for High-Density and Low-Voltage Operation Flash Memories", IEDM Technical Digest, Dec. 1999, 6 pages.

Suh et al., "A 3.3 V 32 Mb NAND Flash Memory with Incremental Step Pulse Programming Scheme", IEEE Journal of Solid-State Circuits, vol. 30, No. 11, Nov. 1995, 8 pages.

Pham et al., "Methods for Active Boosting to Minimize Capacitive Coupling Effect Between Adjacent Gates of Flash Memory Devices", U.S. Appl. No. 11/319,260, filed Dec. 27, 2005, 34 pages.

Pham et al., "Active Boosting to Minimize Capacitive Coupling Effect Between Adjacent Gates of Flash Memory Devices", U.S. Appl. No. 11/319,908, filed Dec. 27, 2005, 31 pages.

Oowada, "Self-Boosting Method with Suppression of High Lateral Electric Fields", U.S. Appl. No. 11/394,460, filed Mar. 30, 2006, 41 pages.

Oowada, "Self-Boosting System with Suppression of High Lateral Electric Fields", U.S. Appl. No. 11/394,803, filed Mar. 30, 2006, 40 pages.

* cited by examiner

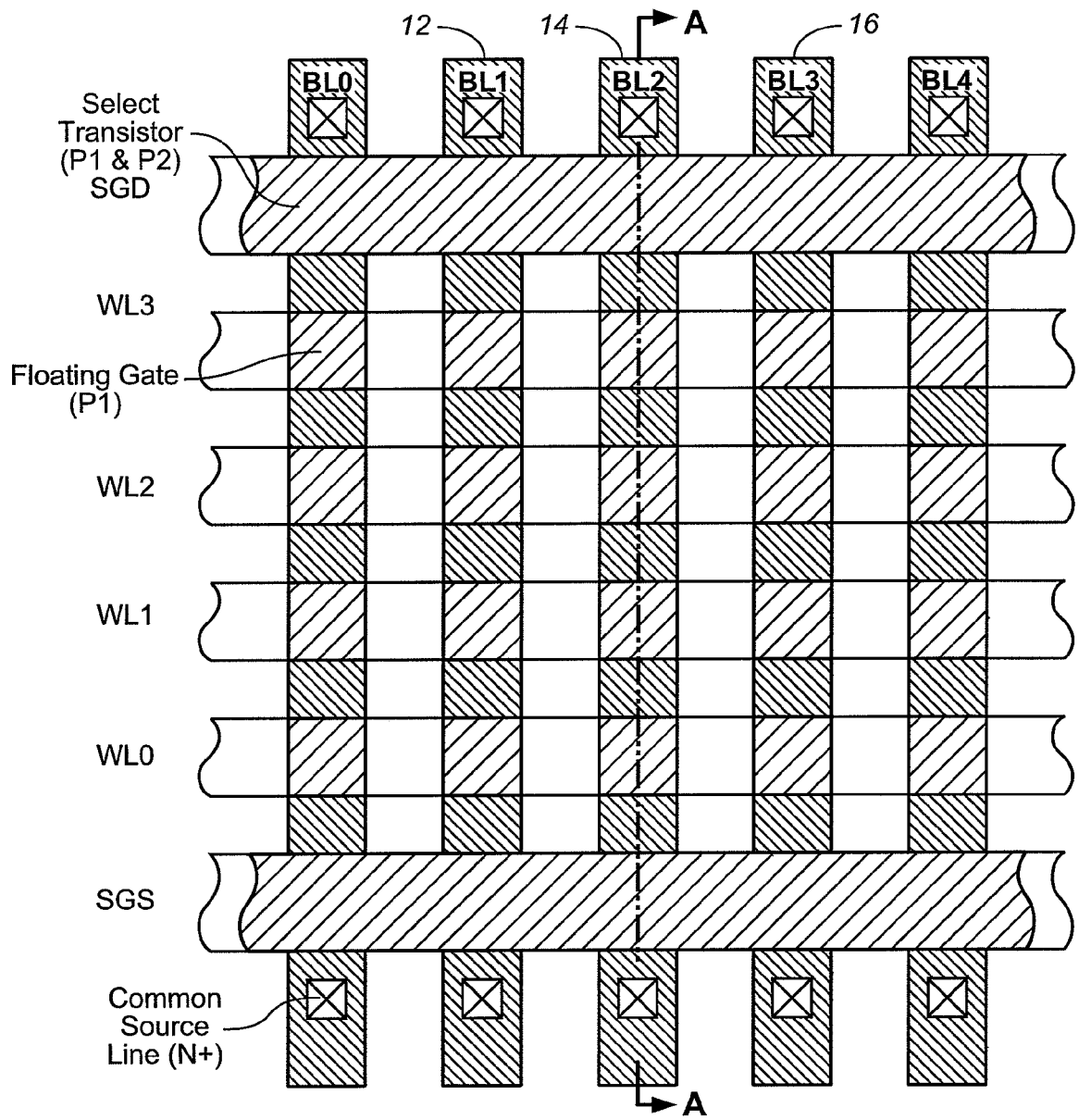
FIG. 2A *(PRIOR ART)*

(Section A-A)

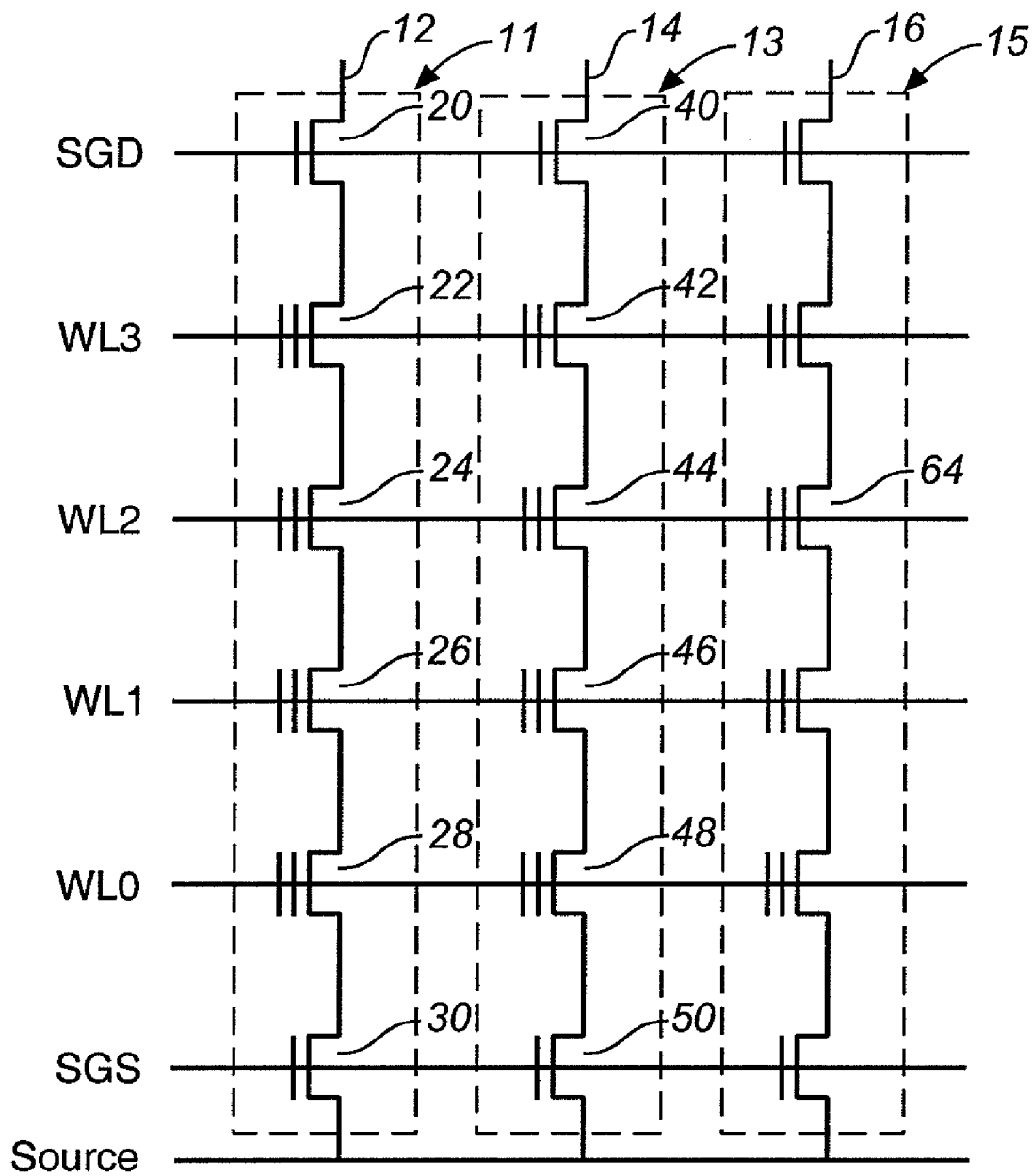
FIG. 3A *(PRIOR ART)*

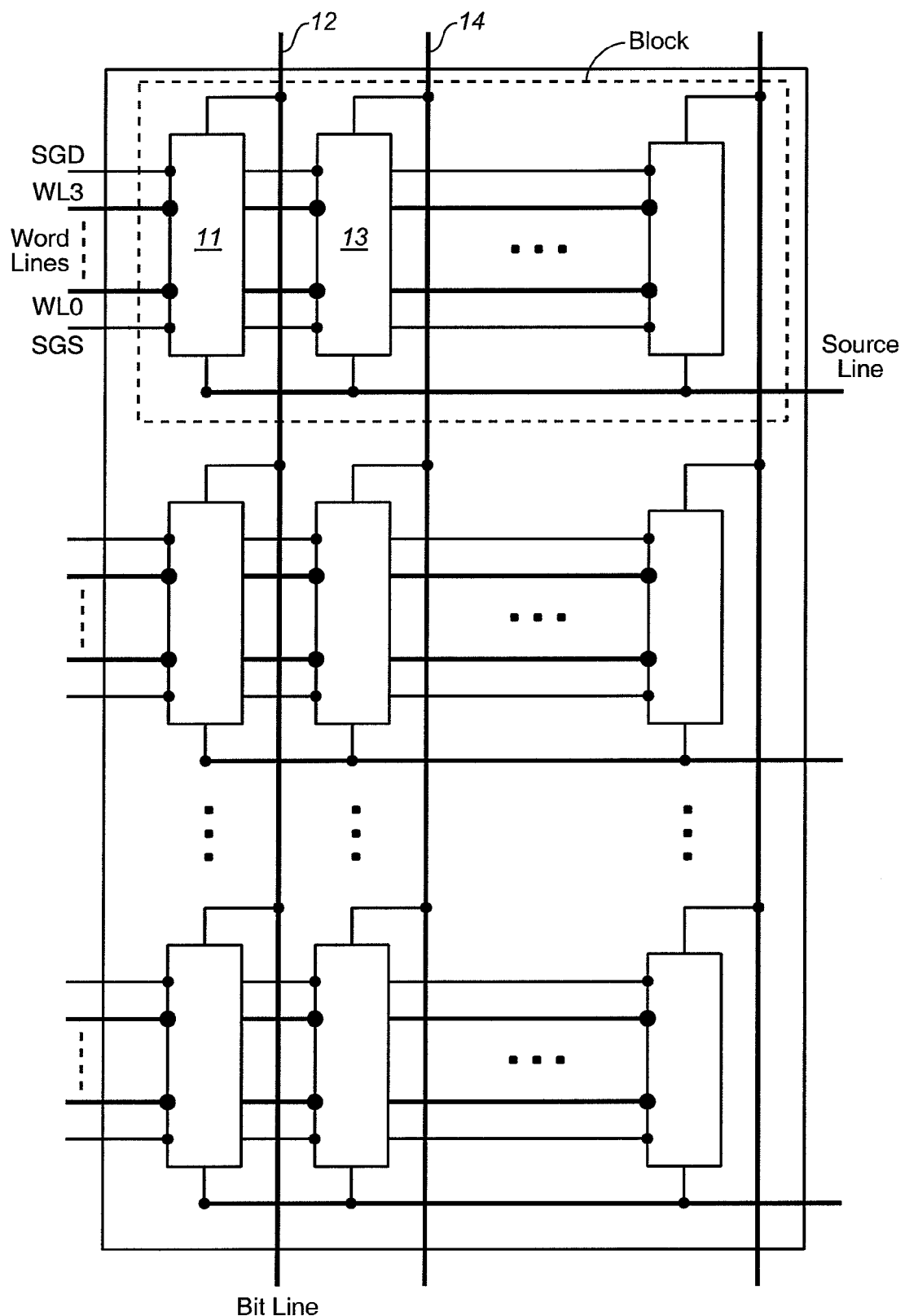
FIG. 3B *(PRIOR ART)*

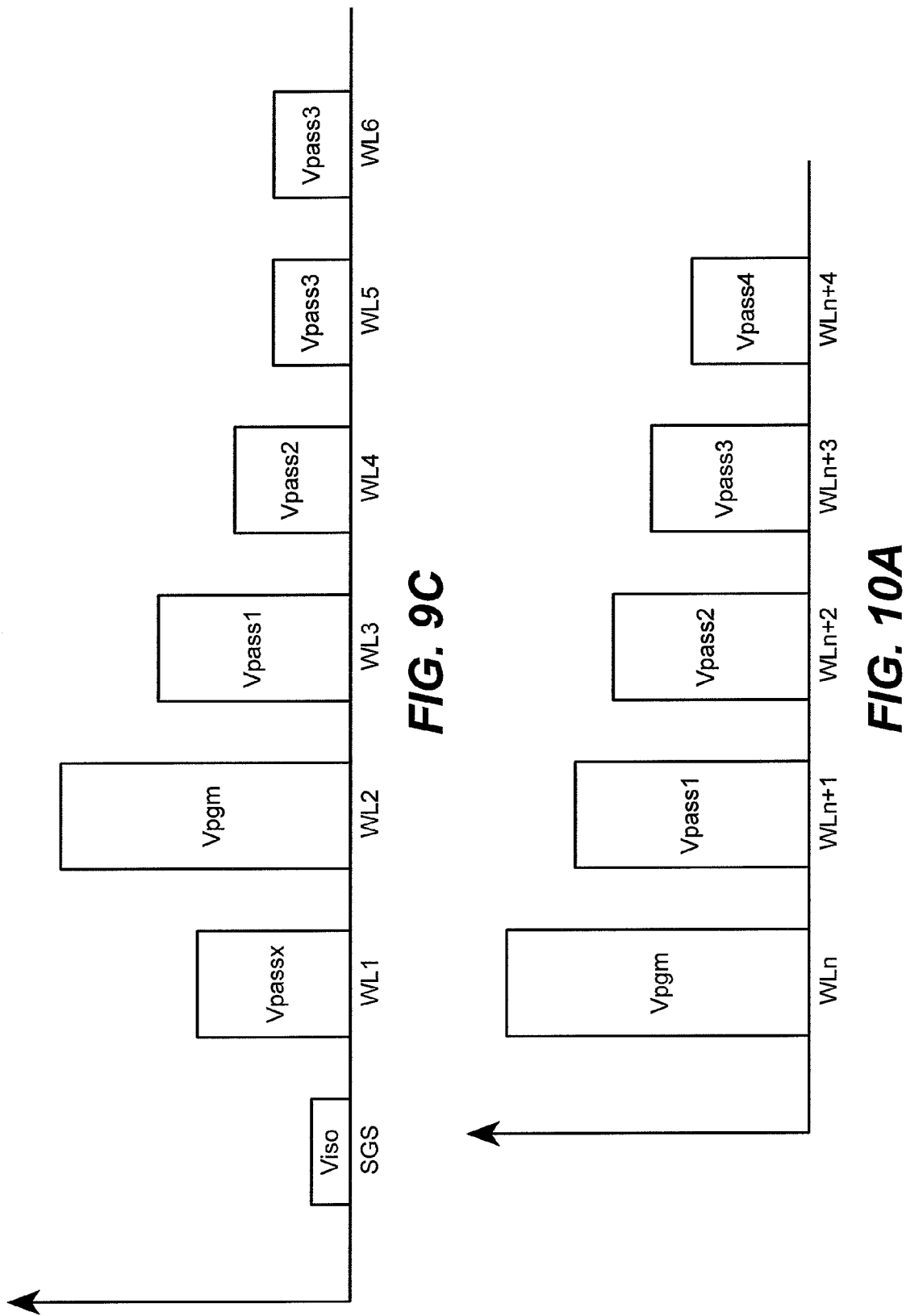

BOOSTING METHODS FOR NAND FLASH MEMORY

CROSS-REFERENCE TO RELATED APPLICATIONS

This application is related to U.S. patent application Ser. No. 11/381,865, entitled, "NAND Flash Memory with Boosting," filed on the same day as the present application; which application is incorporated herein as if fully set forth in its entirety.

BACKGROUND OF THE INVENTION

This invention relates generally to non-volatile semiconductor memories of the flash EEPROM (Electrically Erasable and Programmable Read Only Memory) type, particularly to structures and methods of operating NAND types of memory cell arrays. All patents, patent applications and other material cited in the present application are hereby incorporated by reference in their entirety.

There are many commercially successful non-volatile memory products being used today, particularly in the form of small form factor cards, which use an array of flash EEPROM cells.

An example memory system is illustrated by the block diagram of FIG. 1. A memory cell array 1 including a plurality of memory cells arranged in a matrix is controlled by a column control circuit 2, a row control circuit 3, a c-source control circuit 4 and a c-p-well control circuit 5. The memory cell array 1 is, in this example, a NAND type flash memory array. A control circuit 2 is connected to bit lines (BL) of the memory cell array 1 for reading data stored in the memory cell, for determining a state of the memory cells during a program operation, and for controlling potential levels of the bit lines (BL) to promote the programming or to inhibit the programming. The row control Circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (cell P-well) on which the memory cells are formed. The c-source control circuit 4 controls a common source line connected to the memory cells. The c-p-well control circuit 5 controls the cell P-well voltage.

The data stored in the memory cells are read out by the column control circuit 2 and are output to external I/O lines via an I/O line and a data input/output buffer 6. Program data to be stored in the memory cells are input to the data input-output buffer 6 via the external I/O lines, and transferred to the column control circuit 2. The external I/O lines are connected to a controller 9. The controller 9 includes various types of registers and other memory including a volatile random-access-memory (RAM) 10.

Command data for controlling the flash memory device are inputted to command circuits 7 connected to external control lines that are connected with the controller 9. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 9 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 11A that includes the controller 9, and one or more integrated circuit chips 11B that each contains a memory array and associated control, input/output and state machine circuits. It is possible to integrate the memory array and controller circuits of a system together on one or more integrated circuit chips.

The memory system of FIG. 1 may be embedded as part of the host system, or may be included in a memory card that is removably insertable into a mating socket of a host system. Such a card may include the entire memory system, or the controller and memory array, with associated peripheral circuits, may be provided in separate cards. Several card implementations are described, for example, in U.S. Pat. No. 5,887,145, which patent is expressly incorporated herein in its entirety by this reference.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 (of which BL1-BL3 are also labeled 12-16) represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 (labeled P2 in FIG. 2B, a cross-sectional along line A-A of FIG. 2A) and string selection lines SGD and SGS extend across multiple strings over rows of floating gates, often in polysilicon (labeled P1 in FIG. 2B). However, for transistors 40 and 50, the control gate and floating gate may be electrically connected (not shown). The control gate lines are typically formed over the floating gates as a self-aligned stack, and are capacitively coupled with each other through an intermediate dielectric layer 19, as shown in FIG. 2B. The top and bottom of the string connect to the bit line and a common source line respectively, commonly through a transistor using the floating gate material (P1) as its active gate electrically driven from the periphery. This capacitive coupling between the floating gate and the control gate allows the voltage of the floating gate to be raised by increasing the voltage on the control gate coupled thereto. An individual cell within a column is read and verified during programming by causing the remaining cells in the string to be turned on by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

Relevant examples of NAND type flash memories and their operation are provided in the following U.S. patents/patent applications, all of which are incorporated herein by reference: U.S. Pat. Nos. 5,570,315; 5,774,397; 6,046,935, 6,456,528 and 6,522,580.

The charge storage elements of current flash EEPROM arrays are most commonly electrically conductive floating gates, typically formed from doped polysilicon material. However, other materials with charge storing capabilities, that are not necessarily electrically conductive, can be used as well. An example of such an alternative material is silicon nitride. Such a cell is described in an article by Takaaki Nozaki et al., "A 1-Mb EEPROM with MONOS Memory Cell for Semiconductor Disk Application" IEEE Journal of Solid-State Circuits, Vol. 26, No. 4, April 1991, pp. 497-501.

Memory cells of a typical non-volatile flash array are divided into discrete blocks of cells that are erased together. That is, the block contains the minimum number of cells that are separately erasable together as an erase unit, although more than one block may be erased in a single erasing operation. Each block typically stores one or more pages of data, a page defined as the minimum number of cells that are simultaneously subjected to a data programming and read operation as the basic unit of programming and reading, although more than one page may be programmed or read in a single operation. Each page typically stores one or more sectors of data, the size of the sector being defined by the host system. An example is a sector of 512 byes of user data, following a standard established with magnetic disk drives, plus some number of bytes of overhead information about the user data and/or the block in which it is stored.

As in most integrated circuit applications, the pressure to shrink the silicon substrate area required to implement some integrated circuit function also exists with flash EEPROM arrays. It is continually desired to increase the amount of digital data that can be stored in a given area of a silicon substrate, in order to increase the storage capacity of a given size memory card and other types of packages, or to both increase capacity and decrease size. Another way to increase the storage density of data is to store more than one bit of data per memory cell charge storage element. This is accomplished by dividing the allowable voltage or charge storage window of a charge storage element into more than two states. The use of four such states allows each cell to store two bits of data, eight states stores three bits of data per cell, and so on. A multiple state flash EEPROM structure and operating is described in U.S. Pat. Nos. 5,043,940; 5,172,338, 5,570,315 and 6,046,935.

A typical architecture for a flash memory system using a NAND structure will include NAND arrays, where each array includes several NAND strings. For example, FIG. 3A shows only three NAND strings 11, 13 and 15 of the memory array of FIG. 2A, which array contains more than three NAND strings. Each of the NAND strings of FIG. 3A includes two select transistors and four memory cells. For example, NAND string 11 includes select transistors 20 and 30, and memory cells 22, 24, 26 and 28. NAND string 13 includes select transistors 40 and 50, and memory cells 42, 44, 46 and 48. Each string is connected to the source line by its select transistor (e.g. select transistor 30 and select transistor 50). A selection line SGS is used to control the source side select gates. The various NAND strings are connected to respective bit lines by select transistors 20, 40, etc., which are controlled by select line SGD. In other embodiments, the select lines do not necessarily need to be in common. Word line WL3 is connected to the control gates for memory cell 22 and memory cell 42. Word line WL2 is connected to the control gates for memory cell 24 and memory cell 44. Word line WL1 is connected to the control gates for memory cell 26 and memory cell 46. Word line WL0 is connected to the control gates for memory cell 28 and memory cell 48. As can be seen, each bit line and the NAND strings connected to it form the columns of the array of memory cells. The word lines (WL3, WL2, WL1 and WL0) comprise the rows of the array. Each word line connects the control gates of each memory cell in the row. For example, word line WL2 is connected to the control gates for memory cells 24, 44, and 64.

FIG. 3B is a circuit diagram depicting a number of NAND strings, with each string in a block controlled by a set of common word lines. A block is the unit of erase of a NAND memory array. Strings that share a common set of word lines and source and drain select lines form a block in the NAND design of FIGS. 2A-3B. Strings 11, 13 of FIGS. 2A and 3A-3B appear in a block in FIG. 3B, along with other strings. As shown in FIG. 3B, each NAND string (e.g. 11, 13) in the same array is connected to one of a plurality of bit lines 12, 14, . . . and to a common source line, and are controlled by a common set of word lines (WL0-WL3).

Each memory cell can store data (analog or digital). When storing one bit of digital data (binary memory cell), the range of possible threshold voltages of the memory cell is divided into two ranges which are assigned logical data "1" and "0". In one example of a NAND type flash memory, the threshold voltage is negative after the memory cell is erased, and defined as logic "1." The threshold voltage after a program operation is positive and defined as logic "0." When the threshold voltage is negative and a read is attempted with 0 volt applied to its control gate, the memory cell will conduct current to indicate logic one is being stored. When the threshold voltage is positive and a read operation is attempted, the memory cell will not turn on, which indicates that logic zero is stored. A memory cell can also store multiple levels of information, for example, multiple bits of digital data. In the case of storing multiple levels of data, the range of possible threshold voltages is divided into the number of levels of data. For example, if four levels of information are stored, there will be four threshold voltage ranges, each range assigned to one data value. Memories storing data by differentiation between multiple (i.e. more than two) ranges of threshold voltage are known as multiple state memories. In one example of a NAND type memory, the threshold voltage after an erase operation is negative and defined as "11". Positive threshold voltages are used for the states of "10", "01", and "00."

When programming a NAND flash memory cell, a program voltage is applied to the control gate and the channel area of the NAND string that is selected for programming is grounded (0V). Electrons from the channel area under the NAND string are injected into the floating gate. When electrons accumulate in the floating gate, the floating gate becomes negatively charged and the threshold voltage of the cell is raised. To ground the channel area of the selected NAND string, the corresponding bitline is grounded (0 volt), while the SGD is connected to a sufficiently high voltage (typically $V_{dd}$ at for example 3.3 volts) that is higher than the threshold voltage of the select transistors. To apply the program voltage to the control gate of the cell being programmed, that program voltage is applied on the appropriate word line. As discussed above, that word line is also connected to one cell in each of the other NAND strings that utilize the same word line. For example, when programming cell 24 of FIG. 3A, the program voltage will also be applied to the control gate of cell 44 because both cells share the same word line. A problem arises when it is desired to program one cell on a word line without programming other cells connected to the same word line, for example, when it is desired to program cell 24 and not cell 44. Because the program voltage is applied to all cells connected to a word line, an unselected cell (a cell that is not to be programmed) on the word line may become inadvertently programmed.

For example, cell 44 is adjacent to cell 24. When programming cell 24, there is a concern that cell 44 might unintentionally be programmed. The unintentional programming of the unselected cell on the selected word line is referred to as "program disturb." More generally speaking, "program disturb" is used to describe any unwanted threshold voltage shift, either in the positive or negative direction, which can occur during a programming operation and is not necessarily limited to the selected word line.

Several techniques can be employed to prevent program disturb. One method known as "self boosting" ("SB") is proposed by K. D. Suh et al. in "A 3.3 V 32 Mb NAND Flash Memory with Incremental Step Pulse Programming Scheme," Journal of Solid-State Circuits, Vol 30, No. 11, November 1995, pp. 1149-55. During programming using the SB scheme, the channel areas of the unselected NAND strings are electrically isolated from their corresponding bit lines. Subsequently an intermediate pass voltage (e.g. 10 volts) is applied to the unselected word lines while a high program voltage (e.g. 18 volts) is applied to the selected word line. In this application, the terms "isolate" and "electrically isolate" are used interchangeably, and the terms "writing voltage," "program voltage" and "programming voltage" are used interchangeably. The channel areas of the unselected NAND strings are capacitively coupled to the unselected word lines, causing a voltage (e.g. six volts, assuming a coupling ratio of 0.6) to exist in the channel areas of the unselected NAND strings. This so called "Self Boosting" reduces the potential difference between the channel areas of the unselected NAND strings and the program voltage that is applied to the selected word line. As a result, for the memory cells in the unselected NAND strings and especially for the memory cells in such strings on the selected word line, the voltage across the tunnel oxide and hence the program disturb are significantly reduced.

Referring to FIG. 3A, when a self boosting program technique is applied to the memory array in FIG. 3A to program one of the cells on bit line 12, for example, zero volt is applied to the bit line 12 and voltage $V_{dd}$ (e.g. 3.3 volts) is applied to the bit line 14. The voltage $V_{dd}$ is applied to the drain select line SGD to turn on the transistors 20 and 40 and zero volt is applied to the source select line SGS to turn off transistors 30 and 50. Assuming that all of the memory cells in the array 42-48 are in the normally on states (e.g. erased or negative threshold voltage state), the channel potential of all the cells in the NAND string between transistors 40 and 50 is given by the difference between $V_{dd}$ applied to SGD and the threshold voltage of the select transistor 40. For example, if $V_{dd}$ is 3.3 volts and the threshold voltage of transistor 40 is 1.3 volts, then the channel potential of all the cells 42-48 is charged to 2 volts. The above operation can be referred to as "pre-charging" since the channel potential is pre-charged to a predefined potential of about 2V in this case. Since transistor 50 is turned off and transistor 40 will turn off automatically after the channel potential of the NAND string has reached a sufficiently high value (2V in this case) the channel potential of memory cells 42-48 becomes floating. Therefore, when the high program voltage Vpgm (e.g. 18 volts) is applied to the word line WL2, and an intermediate voltage Vpass (e.g. 10 volts) is applied to the remaining word lines, the channel potential of memory cells 42-48 is bootstrapped or boosted from 2 volts, the initial pre-charged level, to a value such as 8 volts, due to capacitive coupling, assuming a coupling ratio of about 0.6. Therefore, even though a high voltage such as 18 volts is applied to the control gate of memory cell 44, the potential difference between such high voltage and the channel potential is not adequate to cause electron tunneling through the oxide to the floating gate of memory cell 44, thereby preventing program disturb. One problem that may occur during self-boosting is "boosting voltage disturb," (or "Vpass disturb") where the application of Vpass to word lines causes some charging of floating gates under those word lines. Though Vpass is generally chosen to be low (about 10 volts), some charging may occur, especially after repeated application of Vpass to a word line during programming of other word lines. A higher value of Vpass may provide a higher channel voltage for program inhibited strings and thereby allow a lower value of Vpgm to be used, resulting in less Vpgm-disturb. However, higher Vpass results in more boosting voltage disturb. Thus, there is generally a tradeoff in selecting a value for Vpass.

A NAND string is typically (but not always) programmed from the source side to the drain side, for example, from memory cell 28 to memory cell 22. When the programming process is ready to program the last (or near the last) memory cell of the NAND string, if all or most of the previously programmed cells on the string being inhibited (e.g. string 13) were programmed, then there is negative charge in the floating gates of the previously programmed cells. Because of this negative charge on the floating gates, the pre-charging cannot take place completely, resulting in a lower initial potential of the channel area under the NAND string and the subsequent self-boosting of such channel area becomes less effective as well. Therefore, the boosted potential in the channels of the unselected NAND strings may not become high enough and there still may be program disturb on the last few word lines. For example, when programming voltage is applied to WL3, if cells 48, 46, and 44 on a string that is inhibited were programmed, then each of those memory cells 44, 46, 48 has a negative charge on its floating gate which will limit the boosting level of the self boosting process and possibly cause program disturb on cell 42.

In view of the above problem, as an improvement, T. S. Jung et al. proposed a local self boosting ("LSB") technique in "A 3.3V 128 Mb Multi-Level NAND Flash Memory for Mass Storage Applications", ISSCC96, Session 2, Flash Memory, Paper TP 2.1, IEEE, pp. 32.

In the LSB scheme, when applying a high programming voltage to the word line WL2, in order to reduce or prevent program disturb in regard to memory cell 44 on a string that is inhibited, an isolating voltage (typically 0 volts) is applied to word lines WL1 and WL3 so that memory cells 42 and 46 are turned off. Then the channel potential in memory cell 44 is then not influenced, or at least less influenced, by the self boosting in the channel regions of memory cells 42, 46, and 48. Therefore, the channel potential of the channel region of memory cell 44 may be self boosted by the high programming voltage Vpgm to a voltage level that is higher than that achieved when the channel region of memory cell 44 is influenced by the self boosting in the remaining memory cells 42, 46, and 48. This prevents program disturb when memory cell 24 is being programmed. For a more detailed explanation of self boosting and local self boosting, please see U.S. Pat. No. 6,107,658, especially the description in columns 6-10.

Another technique proposed as an alternative to local self boosting is described in U.S. Pat. No. 6,525,964 to Tanaka et al. and is known as erased area self boosting ("EASB"). EASB differs from LSB in that, instead of turning off both memory cells on either side of the unselected cell to prevent program disturb of the cell as in LSB, EASB turns off only the memory cell on the source side of the unselected cell. For example, where memory cell 24 is being programmed, only memory cell 46 is being turned off without turning off memory cell 42, in order to prevent program disturb at cell 44. Thus, an isolating voltage is supplied to the neighboring word line on the source side of the selected word line.

One problem with both LSB and EASB techniques occurs when a low isolating voltage is generally applied to adjacent word lines on both sides (LSB) or an adjacent word line on one side (EASB). Such a low voltage (e.g. 0 volts) may affect the voltage of a floating gate that is to be programmed. FIG. 4A shows a cross section of a NAND string during LSB programming of a row of memory cells under word line WLn. Capacitive coupling between floating gate FGn and adjacent word lines WLn−1 and WLn+1 is also shown in FIG. 4A. FIG. 4B shows the voltages supplied to word lines WLn−3 to WLn+3 during programming of cells along word line WLn (i.e. when WLn is the selected word line). As shown in FIG. 4B, the word lines immediately adjacent to word line WLn, word lines WLn−1 and WLn+1, receive an isolating voltage (Viso) to cause memory cells under WLn−1 and WLn+1 to turn off, thus isolating the portion of the substrate under WLn. However, the voltages on word lines WLn−1 and WLn+1 are capacitively coupled to floating gates under adjacent word lines. In particular, voltages on word lines WLn−1 and WLn+1 are capacitively coupled to floating gate FGn, a floating gate under selected word line WLn. In this example, floating gate FGn is being programmed, so the channel under floating gate FGn is held at a low voltage (typically 0 volts). In order to cause electrons to tunnel through the gate oxide layer into floating gate FGn, the voltage of floating gate FGn is raised to a high voltage by applying a programming voltage (about 18-20 volts) on word line WLn. However, the low isolation voltages on WLn−1 and WLn+1 coupled to floating gate FGn make this more difficult. These low voltages tend to counteract the coupling of high voltage Vpgm from word line WLn. The result is that a voltage used for Vpgm may be higher than desired, increasing disturb problems in other floating gates. Also, programming may take longer than it would if it were not for the coupling of low voltages by word lines WLn−1 and WLn+1. While FIGS. 4A and 4B show the problem for the LSB situation, the problem also occurs in EASB schemes, though only on one side of the selected word line.

While LSB and EASB maybe advantageous for many applications, certain problems are still encountered when these schemes are used in their current form, especially when the memory cell dimensions of future generation devices are continually reduced or scaled down. In particular, as memory arrays are reduced in size, not all dimensions are reduced in proportion. Typically, in a NAND flash memory such as shown in FIG. 4A, the Inter Poly Dielectric (IPD) layer that separates word lines from underlying floating gates is not reduced in proportion to a reduction in spacing between adjacent word lines or floating gates. Thus, as an array shrinks, the coupling between WLn−1 and FGn increases relative to the coupling between WLn and FGn. Thus, the coupling of isolating voltage from word lines adjacent to the selected word line, described above with respect to FIGS. 4A and 4B, generally becomes more significant as memory array dimensions shrink.

SUMMARY OF THE INVENTION

A boosting voltage scheme applies higher boosting voltages to an unselected word line adjacent to the selected word line than to an unselected word line that is farther away from the selected word line. The boosting voltages applied to the selected word line and adjacent unselected word lines shows a stair-like pattern, with voltage descending from a program voltage on the selected word line to a higher boosting voltage on a word line adjacent to the selected word line and a lower boosting voltage on a word line farther away from the selected word line. All, or just some, of the unselected word lines of a block may receive boosting voltages according to a stair-like boosting voltage scheme. In some cases, only unselected word lines near the selected word line receive voltages according to a stair-like boosting voltage scheme. Other unselected word lines receive a default boosting voltage.

A higher boosting voltage applied to a word line adjacent to the selected word line tends to couple to a selected floating gate (a floating gate under the selected word line). Thus, the higher boosting voltage works with the programming voltage to cause charging of the floating gate. However, by only applying higher boosting voltage to a limited number of word lines, problems caused by such higher boosting voltage (boosting voltage disturb) are kept at a low level. By applying a series of descending voltages to word lines near a selected word line, an appropriate balance is maintained between the advantages of higher boosting voltage (coupling higher voltage to selected floating gates and to the channel), which increase closer to the selected word line, and the disadvantages of higher boosting voltage (boosting voltage disturb), which are generally not dependent on distance from the selected word line. Using a high boosting voltage for word lines adjacent to the selected word line assists in causing charge to flow to floating gates and may allow a reduced programming voltage to be used, thus reducing Vpgm-disturbs.

A stair-like boosting voltage scheme may be combined with applying an isolating voltage to one or more word lines to provide a modified LSB or EASB scheme. In one example, an isolating voltage is applied to the adjacent unselected word line on one side of the selected word line and two or more boosting voltages that descend with distance from the selected word line are applied to unselected word lines on the other side of the selected word line. In another example, a stair like pattern of voltages is applied to two or more word lines on either side of the selected word line and isolating voltages are applied to word lines on either side of these two or more word lines. In this way, boosting is confined to a region close to the selected word line.

The voltages applied to both selected and unselected word lines may be increased in steps to reduce disturbance caused by voltage changes. In one example, the selected word line and two adjacent unselected word lines are raised to a first boosting voltage. Then, the closer of the two unselected word lines and the selected word line are raised to a higher second boosting voltage while maintaining the farther unselected word line at the first boosting voltage. Then, the selected word line is raised to a programming voltage while the first and second boosting voltages are maintained to the farther and closer word lines respectively. In this way, a series of voltages are applied to an individual word line in a stair-like pattern over time until a final voltage is reached. The final voltages for adjacent word lines form a stair-like pattern with a programming voltage being applied to a selected word line and a series of boosting voltages (less than the programming voltage) being applied so that boosting voltage descends with distance from the selected word line. In an alternative scheme, unselected word lines are ramped directly to their desired boosting voltages at a first time. The selected word line is ramped to a voltage equal to the highest boosting voltage (boosting voltage of word lines adjacent to selected word line) at this time. Subsequently, the selected word line is ramped to a programming voltage and unselected word lines remain at their desired boosting voltages.

BRIEF DESCRIPTION OF THE DRAWINGS

FIG. 2A is a plan view of a prior art NAND array of the prior art.

FIG. 3A is a circuit diagram depicting three of the prior art NAND strings of FIG. 2A.

FIG. 3B is a circuit diagram depicting a number of prior art NAND strings.

FIG. 9C shows another example of a modified stair-like voltage scheme applied to the word lines of FIG. 9A during programming along word line WL2, where reduced boosting voltage is applied to word line WL1 to reduce disturbance caused by hot electrons generated under source select gate.

FIG. 10A shows a stair-like boosting voltage scheme applied to word lines WLn to WLn+4 at a time during programming of memory cells under word line WLn when WLn is at Vpgm.

DETAILED DESCRIPTION OF EXEMPLARY EMBODIMENTS

Figure 5:
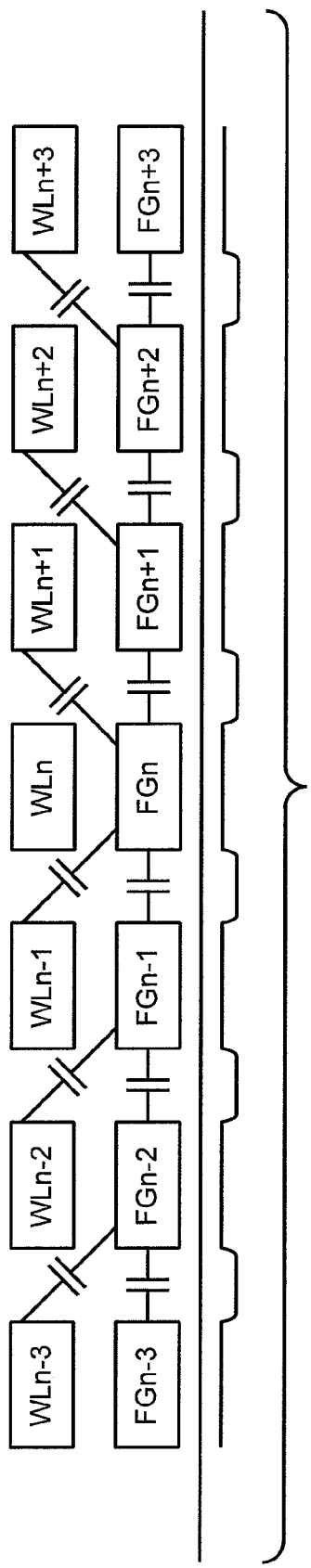
FIG. 5 shows some of the capacitive coupling between components of a NAND string, in particular, the coupling between word lines and floating gates under adjacent floating gates.

FIG. 5 shows a cross section of a portion of a NAND string in a flash memory array undergoing programming according to an embodiment of the present invention. FIG. 5 shows capacitors representing capacitive coupling between some of the elements of the NAND string. Not all couplings between elements are shown. For example, word lines are strongly coupled to directly underlying floating gates allowing floating gates to be programmed. Also, both floating gates and word lines are coupled to a portion of the underlying substrate. The particular couplings shown are chosen to illustrate some of the advantages of this embodiment over prior art programming schemes. Also, the couplings shown are becoming more significant as lateral dimensions of NAND arrays are scaled down in size more rapidly than vertical dimensions are scaled.

Figure 6:
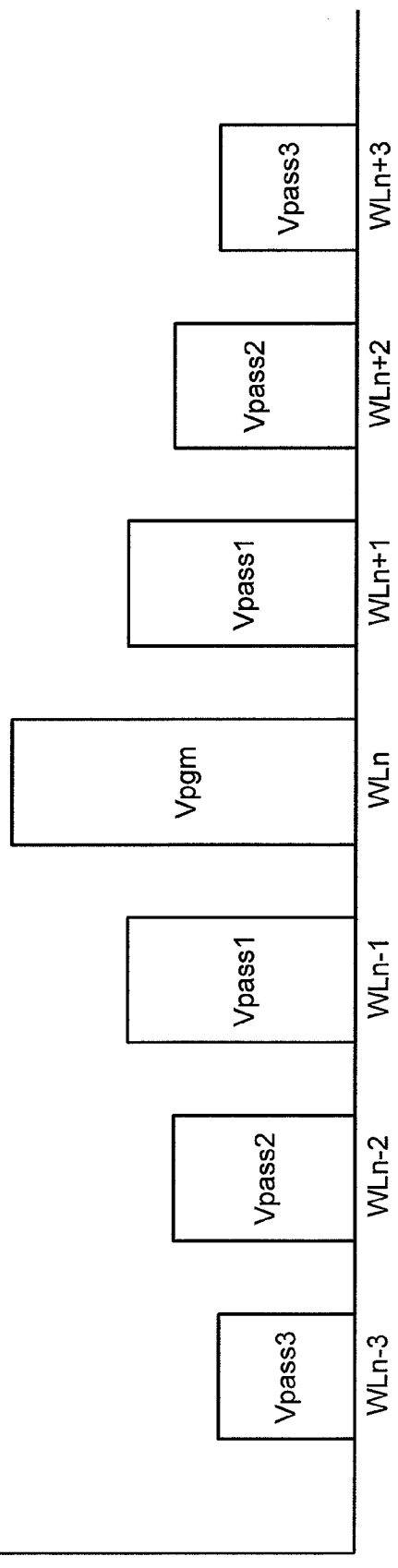
FIG. 6 shows stair-like boosting voltages applied to word lines of the NAND string of FIG. 5 according to an embodiment of the present invention.

FIG. 6 shows voltages applied to word lines WLn−3 to WLn+3 of FIG. 5 according to one embodiment of the present invention. WLn is the selected word line and a programming voltage Vpgm is applied to WLn. Word lines WLn−1 and WLn+1 that are adjacent to word line WLn on either side of WLn, receive a first boosting voltage Vpass1. Word lines WLn−2 and WLn+2 that are adjacent to word lines WLn−1 and WLn+1 receive a second boosting voltage Vpass2 that is less than first boosting voltage Vpass1. Word lines WLn−3 and WLn+3 that are adjacent to word lines WLn−2 and WLn+2 receive a third boosting voltage Vpass3 that is less than Vpass2. Thus, voltages on word lines WLn−3 to WLn+3 form a stair-like voltage scheme, with boosting voltages descending as distance from the selected word line increases. Additional word lines may follow this pattern. In some cases, all unselected word lines of a string may receive boosting voltages according to a stair-type voltage scheme. In other cases, just the unselected word lines near the selected word line have stair-type voltages and other unselected word lines receive a default boosting voltage. Thus, in the embodiment of FIG. 6, additional word lines (not shown) may receive additional boosting voltages such as Vpass 4, Vpass5 . . . etc, or additional word lines may all receive Vpass3, or some other default boosting voltage. Unlike LSB and EASB schemes described above, no isolating voltage is provided in the scheme of FIG. 6 so that the memory cells underlying word lines WLn−3 to WLn+3 are turned on. Memory cells in strings that receive a programming voltage from a bit line and those strings that receive a program inhibit voltage from a bit line are both turned on. Thus, the source/drain and channel regions of a string form an electrically continuous strip. In this way, the programming scheme of FIG. 6 is similar to an SB scheme. However, using a range of different boosting voltages in a stair-type scheme has advantages over a conventional SB scheme using a single boosting voltage for all unselected word lines.

Figure 1:
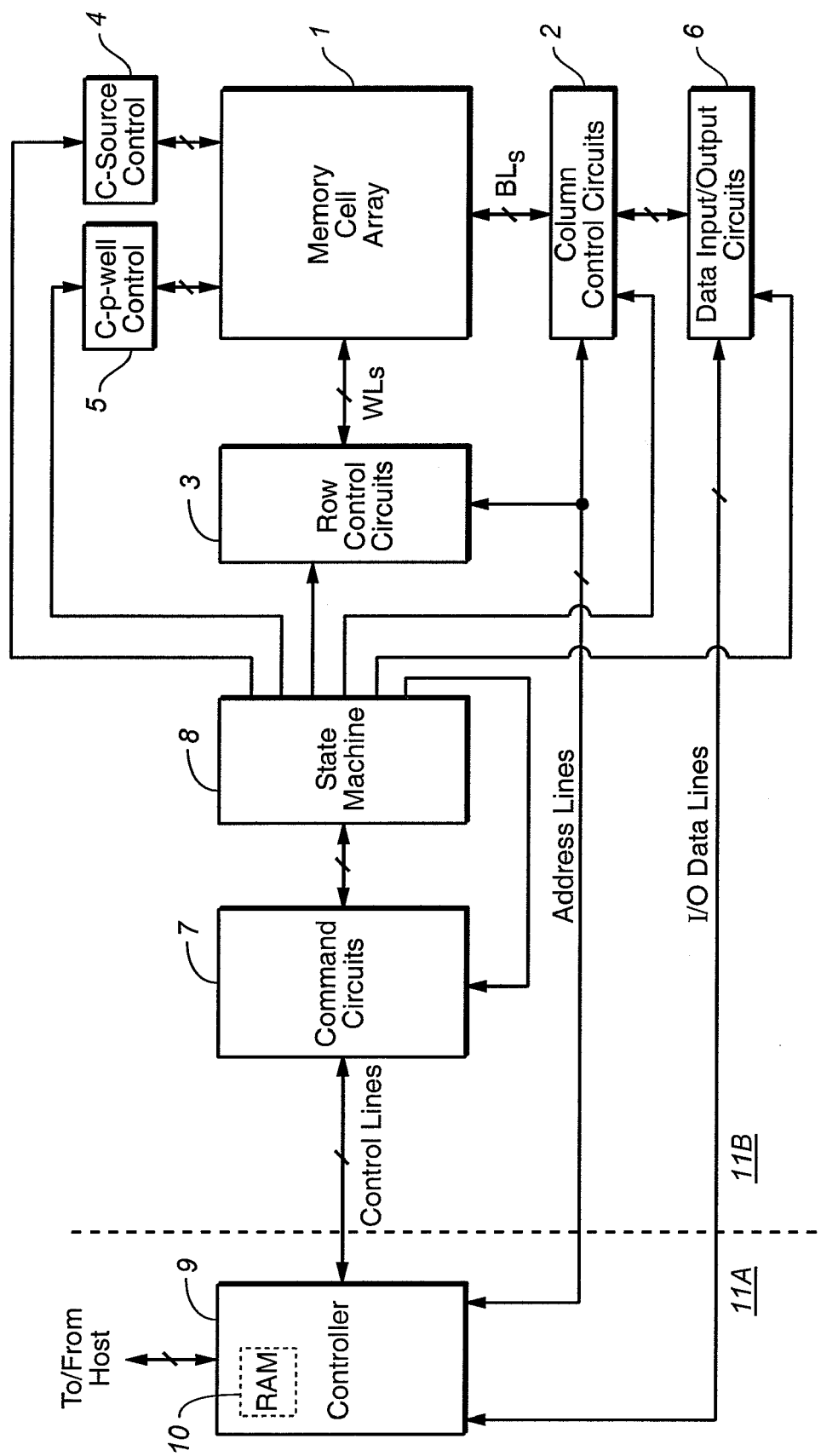
FIG. 1 is the block diagram of a type of prior art memory system in which the memory cell array and operational improvement of the present invention may be implemented.
Figure 2B:
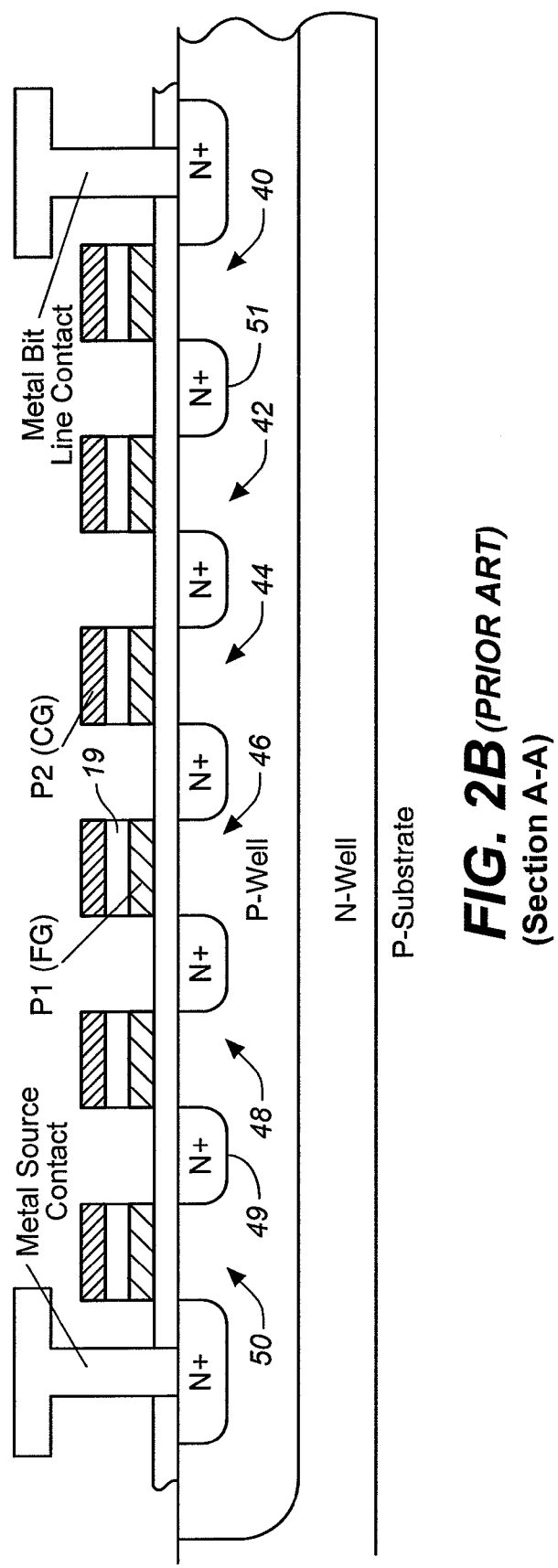
FIG. 2B is a cross-sectional view of the prior art NAND array of FIG. 2A taken along the line A-A.
Figure 4A:
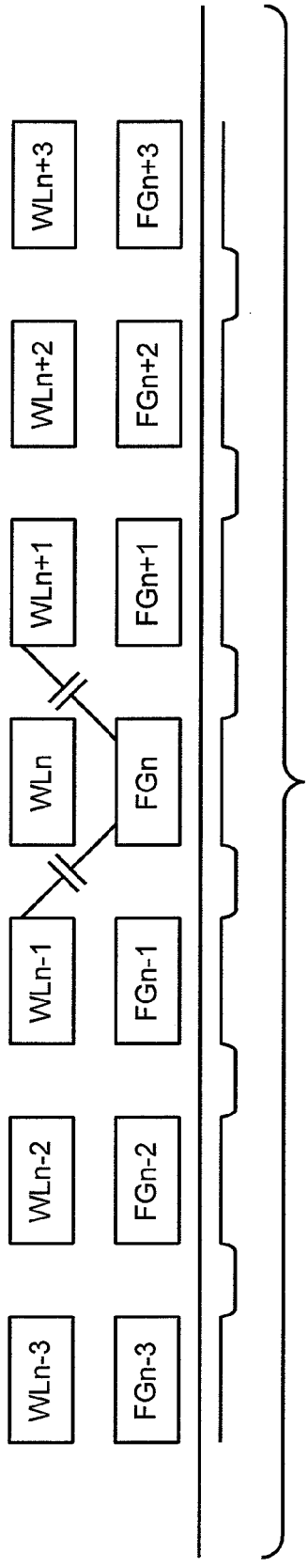
FIG. 4A shows a cross section of a prior art NAND string during programming of a floating gate including capacitive coupling between a selected floating gate and adjacent word line.
Figure 4B:
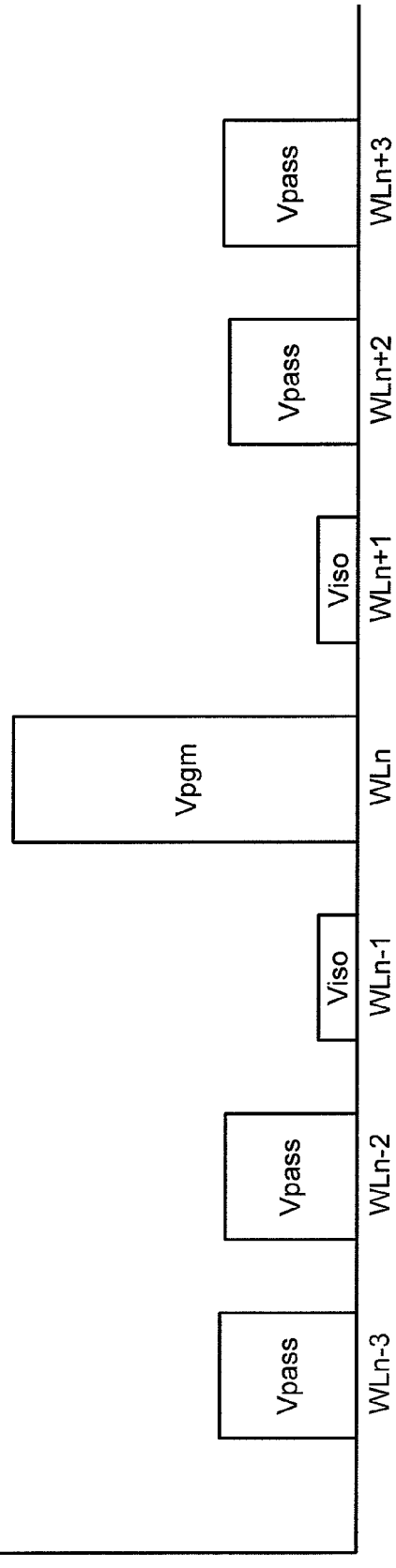
FIG. 4B shows the voltages applied to word lines of the prior art NAND string of FIG. 4A during programming according to an LSB scheme.

Boosting voltage Vpass1 is the highest boosting voltage used and is applied only to word lines WLn−1 and WLn+1, which are adjacent to the selected word line. Word lines WLn−1 and WLn+1 are coupled to floating gate FGn and thus tend to increase the voltage on floating gate FGn. This helps to program floating gate FGn. In contrast to the LSB example of FIGS. 4A and 4B, the high boosting voltage Vpass1 acts in conjunction with Vpgm to raise the voltage of floating gate FGn so that a lower voltage may be used for Vpgm than would otherwise be used. Using a lower voltage for Vpgm reduces Vpgm-disturbance.

Word lines WLn−3, WLn−2, WLn+2 and WLn+3 are further away from WLn than WLn−1 and WLn+1 are, and are thus less coupled to WLn than WLn−1 and WLn+1 are. Word lines WLn−2 and WLn+2 are primarily coupled to floating gate FGn through floating gates FGn-1 and FGn+1. Word lines WLn−3 and WLn+3 are also primarily coupled to floating gate FGn through adjacent floating gates. Word lines WLn−1 and WLn+1 receive voltages Vpass2 and Vpass 3 that are lower than Vpass1. Because these word lines are less coupled to WLn, there is less reason to apply high voltages, and by keeping Vpass2 and Vpass3 relatively low, the risk of boosting voltage disturb is reduced. In particular, the relatively high voltage Vpass1 is only applied to two word lines during programming of the cells of a particular word line. Thus, during programming of a string, a word line generally experiences Vpass1 twice, when adjacent word lines on either side are selected. Thus, unlike prior SB schemes, a relatively high value of Vpass1 may be used without exposing cells to the risk of boosting voltage disturb that would occur if such a voltage were to be applied to all unselected word lines. Other boosting voltages, such as Vpass3 may be lower so that the risk of boosting voltage disturb is accordingly lower.

Of course, other stair-like voltage schemes are possible and the present embodiment is not limited to any particular voltage values. For example, two or more word lines could have Vpass1 applied. Similarly, two or more word lines could have Vpass2 applied, two or more word lines could have Vpass3 applied, and so on. Such a scheme could still achieve the benefit of applying different Vpass voltages by using a higher Vpass value near the selected word line and a lower Vpass value further away from the selected word line.

Figure 7:
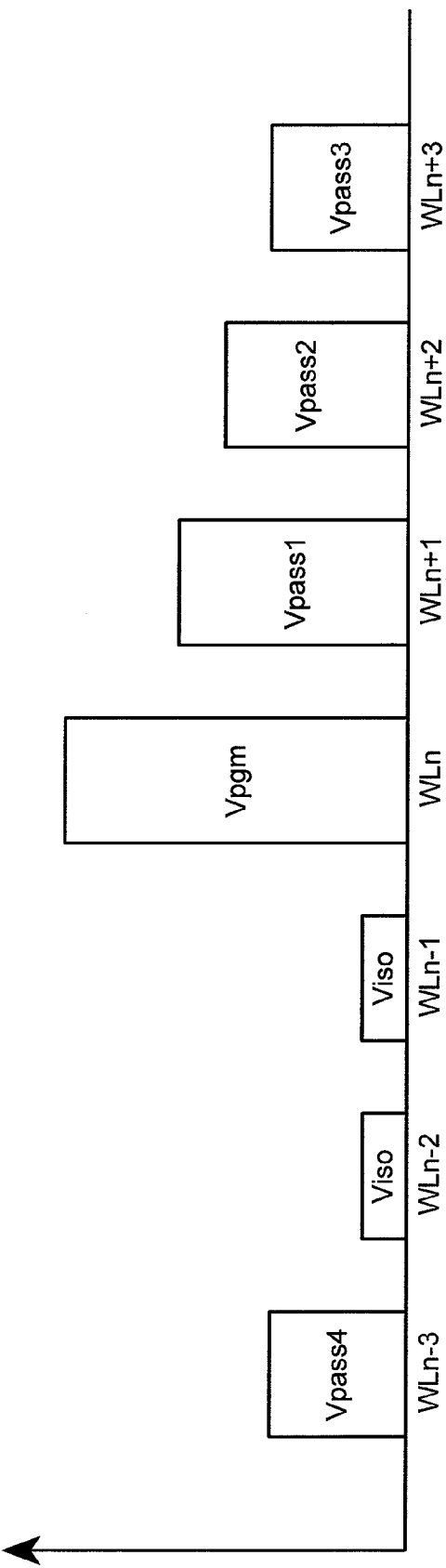
FIG. 7 shows stair-like boosting voltages applied to word lines of the NAND string of FIG. 5 on one side of a selected word line and isolating voltages applied to word lines on the other side of the selected word line according to another embodiment of the present invention.

In another embodiment, shown in FIG. 7, a modified EASB scheme is applied. In contrast to the embodiment of FIG. 6, here a stair-type voltage scheme is only applied to word lines on one side of the selected word line. The stair-type voltage scheme is generally applied on the erased side (drain, or bit line side). On the programmed side (source side) an isolation voltage (Viso) is provided so that the channel region of a sting is not electrically continuous and the channel under word lines WLn to WLn+3 is isolated from the channel under word line WLn−3. Isolating voltage Viso may be 0 volts or some other voltage to turn off a floating gate transistor (the X-axis does not necessarily intersect the Y-axis at zero volts in FIG. 7 or other figures). In this case an isolation voltage is applied to two word lines to reduce the risk of Gate Induced Drain Leakage (GIDL). This is a phenomenon that can cause charge leakage through a transistor that is turned off, where the gate length of the transistor is small and the voltage difference between source and drain is large. By using two transistors in a string for isolation, the voltage between source and drain of each one is reduced and the risk of GIDL is reduced. Because isolation is provided so that boosting only occurs in the erased area, this may be considered an example of EASB. However, as in the example of FIG. 6, a stair-type voltage scheme is used for boosting voltages supplied to the erased area. As before, the word line WLn+1 closest to the selected word line WLn receives the highest boosting voltage Vpass1 so that this higher boosting voltage tends to couple to FGn and assist in raising the voltage of FGn and thus causing charge to flow into FGn. Successively lower boosting voltages Vpass2 and Vpass3 are applied to word lines WLn+2 and WLn+3 respectively. Thus, the risk of boosting voltage disturb is reduced because, in this case, a word line only experiences Vpass1 once, when the adjacent word line on the source side is selected. When other word lines are selected, a word line experiences lower Vpass voltages. Because the boosted area is isolated from programmed cells on the source side, programming is less affected by charge on floating gates of programmed cells so that lower Vpgm may be used.

Figure 8:
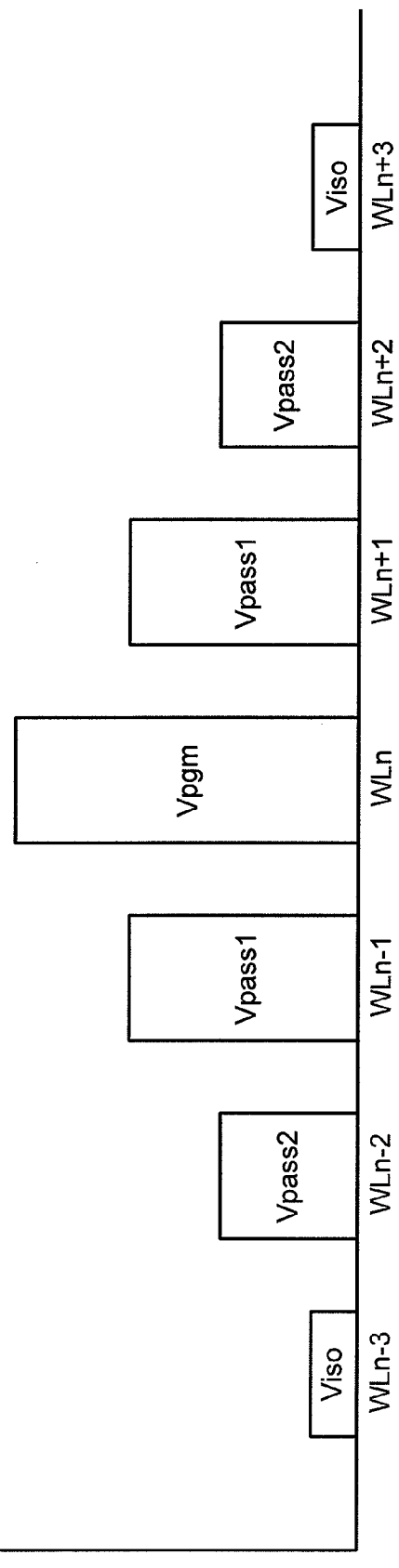
FIG. 8 shows stair-like voltages applied to word lines of the NAND string of FIG. 5 with isolating voltages applied to word lines on either side of the word lines receiving stair-like voltages according to another embodiment of the present invention.

In another embodiment, shown in FIG. 8, a modified LSB scheme is applied. As in FIG. 6, a stair-type boosting voltage scheme is applied to word lines on either side of a selected word line. However, unlike the example of FIG. 6, an isolating voltage (Viso) is provided to word lines on either side of the boosted word lines, thus isolating the boosted area from the rest of the string. This provides isolation from some programmed memory cells and so reduces the effect of charge in the floating gates of such cells. Boosting voltages are only applied to a few word lines (four in this example) so that the risk of boosting voltage disturb is reduced. Isolation voltage (Viso) is shown being applied to one word line on either side of selected word line WLn, though two or more word lines may be used for isolation in some cases.

Figure 9A:
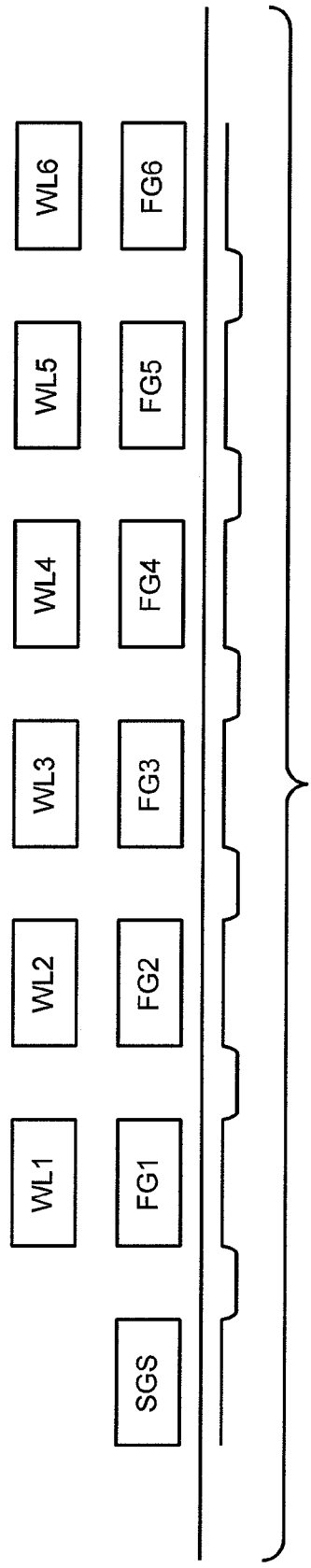
FIG. 9A shows a cross section of one end of a NAND string including a source select gate (SGS) line and multiple word lines and floating gates.
Figure 9B:
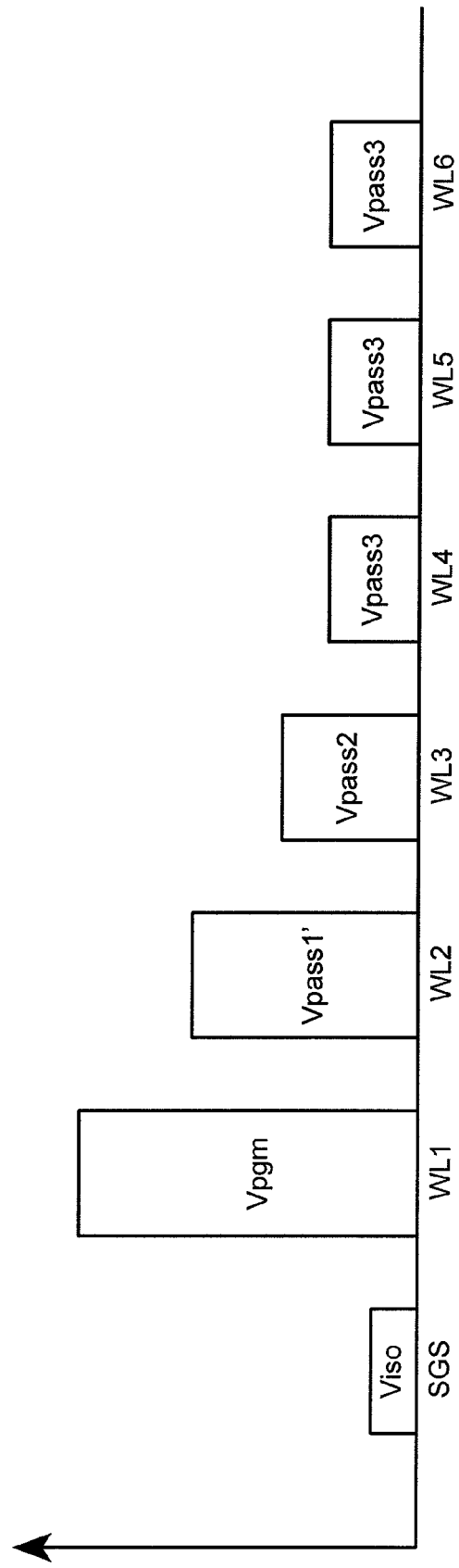
FIG. 9B shows an example of a modified stair-like voltage scheme applied to the word lines of FIG. 9A during programming along word line WL1, where increased boosting voltage is applied to WL2 to counteract the low voltage on select gate line.

FIG. 9A shows an end portion of a NAND-string in cross section. Included in FIG. 9A is a source side select gate (SGS) and word lines WL1-WL6 along with underlying floating gates FG1-FG6. During programming of FG1, Vpgm is applied to WL1 and a stair-type boosting voltage scheme is applied to word lines WL2-WL6 as shown in FIG. 9B. Select gate SGS experiences an isolating voltage Viso that isolates the NAND string from a common source line. However, Viso tends to couple to floating gate FG1, making programming of floating gate FG1 more difficult. To counteract this effect, a voltage Vpass1' may be applied to WL2, where Vpass1' is higher than Vpass1, the voltage that is later applied to unselected word lines adjacent a selected word line, as shown in examples of FIGS. 6-8. Thus, Vpass1' is a boosting voltage used to compensate for the effect of Viso applied to SGS. Other Vpass voltages may also be modified in this case. The values of boosting voltages are not necessarily the same during programming of each word line. Thus, Vpass1, Vpass2, Vpass3 . . . etc may have particular values for programming a particular word line WLn, but different values during programming of another word line WLn+x. While in each case a stair-type voltage scheme may be used, different voltage values may be used during programming of different word lines.

FIG. 9C shows programming of WL2, subsequent to programming of WL1 shown in FIG. 9B. A stair-like voltage scheme is applied to word lines WL3 to WL6 as previously shown in FIGS. 6 and 7. Word line WL3, which is immediately adjacent to selected word line WL2 on the drain side, receives voltage Vpass1. However, word line WL1, which is immediately adjacent to selected word line WL2 on the source side in this case does not receive Vpass1. Instead, WL1 receives Vpassx. In this example, Vpassx is a Vpass voltage that is less than Vpass1. Because a high Vpass voltage (such as Vpass1) applied to WL1 could cause hot electrons to be generated under select gate SGS and injected into FG1 or FG2, a lower Vpass voltage (Vpassx) is used. The phenomenon of disturbance caused by hot electron injection at SGS and suppression of this problem using reduced Vpass voltage for WL1 is discussed in more detail in US Patent Publication 2005/0174852. Techniques described in that application may be combined with embodiments of the present invention to achieve benefits of both approaches. While Vpassx is shown being between Vpass1 and Vpass2, in other examples Vpassx may be equal to or less than Vpass2. FIG. 9C shows an example of an asymmetric stair-like voltage scheme according to an embodiment of the present invention. Various other stair-like voltage schemes, both symmetric and asymmetric are within the scope of the present invention.

FIG. 10A shows a stair-like voltage scheme applied to unselected word lines WLn+1 to WLn+4 during programming of WLn. In this case, four boosting voltages (Vpass1-Vpass4) are applied to word lines WLn+1 to WLn+4. Voltages Vpass1-Vpass4 have a stair-like profile with voltage diminishing according to distance from selected word line WLn. On the other side of selected word line WLn (WLn−1 etc, not shown in FIG. 10A) Vpass voltages are applied that mirror those of word lines WLn+1 to WLn+4. In alternative embodiments, an isolating voltage may be applied to one or more word lines on the other side of selected word line WLn. In other alternatives, some other combination of Vpass voltages and isolation voltages may be applied to word lines on the other side of WLn. This embodiment does not require voltages to be applied symmetrically about the selected word line in order to obtain benefits of the voltage scheme. Even where the stair-like voltage scheme is only applied on one side of the selected word line, some benefit may result. FIG. 10A shows a static view of voltages applied at a particular time during programming of cells along word line WLn. In this example, boosting voltages are not immediately applied at their final level but instead are increased incrementally to a final level.

Figure 10B:
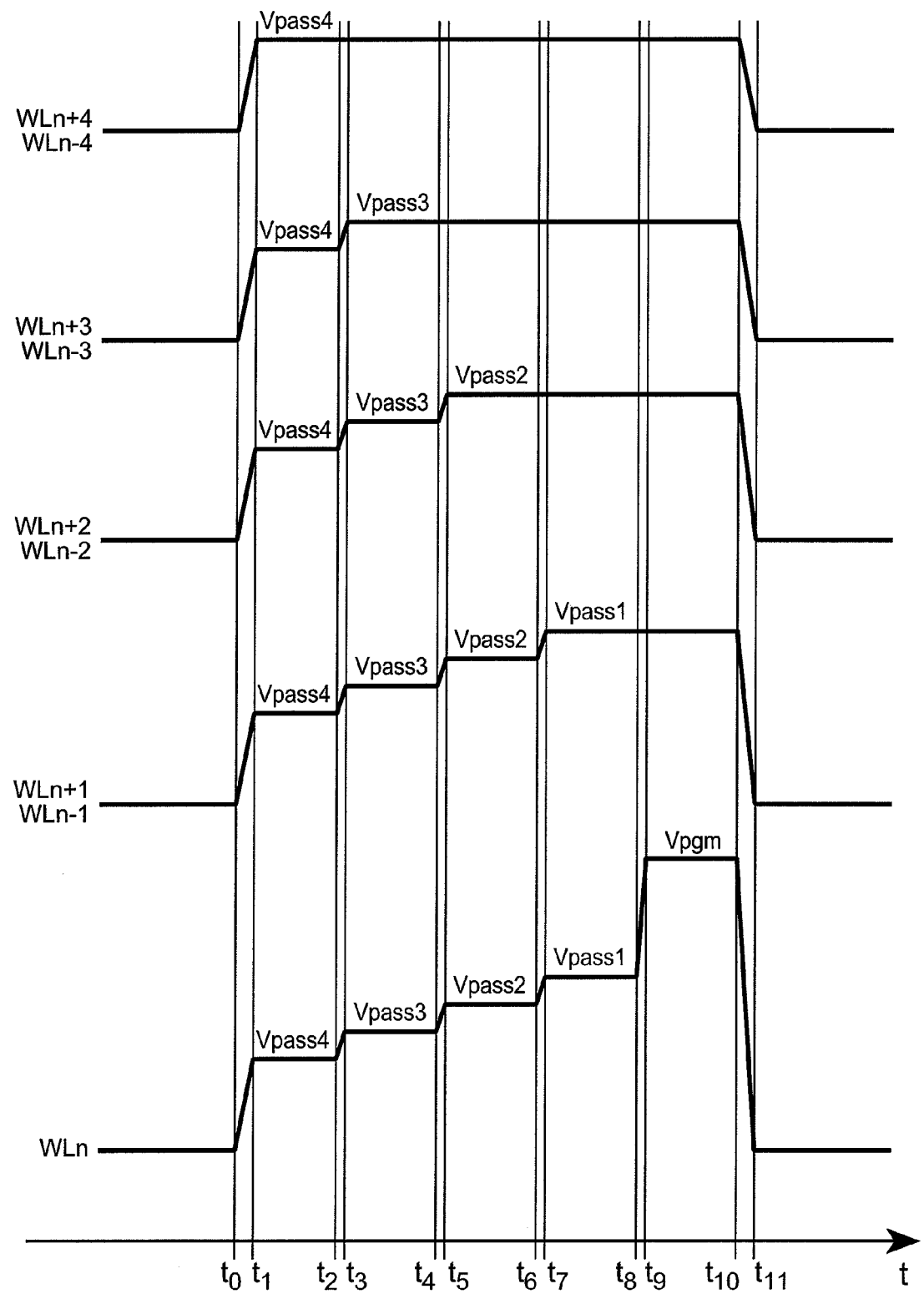
FIG. 10B shows the voltages applied to word lines WLn−4 to WLn+4 during programming of memory cells under WLn of FIG. 10A over a time period that includes the time when WLn is at Vpgm, including the stair like increases in boosting voltages from a base voltage.

FIG. 10B shows a timing diagram of voltages applied to word lines WLn−4 to WLn+4 of FIG. 10A over a time that includes the time represented by FIG. 10A (time period $t_9$ to $t_{10}$ in FIG. 10B). Prior to $t_9$, voltages are increased in steps until they reach their final values. The example of FIG. 10B shows selected word line WLn having voltage increases in a stair-like manner up to Vpgm. Also, word lines WLn+1 to WLn+4 and word lines WLn−1 to WLn−4 undergo stair-like voltage increases. In this example, voltages applied to word lines are symmetric about the selected word line WLn, with word lines WLn+1 and WLn−1 receiving the same voltages, word lines WLn+2 and WLn−2 receiving the same voltages, and so on. In other cases, the voltages may not be symmetrically applied. Prior to time $t_0$, word lines WLn−4 to WLn+4 may be at a base voltage such as zero volts. At time $t_0$, the voltages applied to word lines WLn−4 to WLn+4 are ramped up and at time $t_1$, ramping is stopped and voltages to word lines WLn−4 to WLn+4 are maintained at a voltage of Vpass4. Subsequently, at time $t_2$, voltages applied to word lines WLn−3 to WLn+3 are ramped until time $t_3$, when ramping stops and voltages applied to word lines WLn−3 to WLn+3 are maintained at Vpass3. While voltages applied to word lines WLn−3 to WLn+3 are ramped and maintained at Vpass3, voltages applied to word lines WLn−4 and WLn+4 are maintained at voltage Vpass4 and do not have their voltages ramped. Subsequently, at time $t_4$, voltages applied to word lines WLn−2 to WLn+2 are ramped until time $t_5$, when ramping stops and voltages applied to word lines WLn−2 to WLn+2 are maintained at Vpass2. While voltages applied to word lines WLn−2 to WLn+2 are ramped and maintained at Vpass2, voltages to word lines WLn−4 and WLn+4 are maintained at Vpass4 and voltages to word lines WLn−3 and WLn+3 are maintained at Vpass3 as before. Subsequently, at time $t_6$, voltages applied to word lines WLn−1 to WLn+1 are ramped until time $t_7$, when ramping stops and voltages applied to word lines WLn−1 to WLn+1 are maintained at Vpass1. While voltages applied to word lines WLn−1 to WLn+1 are ramped and maintained at Vpass1, voltages to word lines WLn−4 to WLn−2 and WLn+2 to WLn+4 are maintained at their previous values. Subsequently, at time $t_8$, the voltage applied to selected word line WLn is ramped until time $t_9$, when ramping stops and the voltage applied to word WLn is maintained at a program voltage Vpgm. While the voltage applied to selected word line WLn is ramped and maintained at Vpgm, word lines WLn−4 to WLn−1 and WLn+1 to WLn+4 are maintained at their previous voltages. The voltages applied to word lines WLn−4 to WLn+4 at this time (after time $t_9$) may be seen in FIG. 10A. Subsequently, at time $t_{10}$, the voltages applied to word lines WLn−4 to WLn+4 are ramped down and reach a base voltage at time $t_{11}$.

The voltage scheme shown in the timing diagram of FIG. 10B causes less disturbance to memory cells than if voltages were ramped directly from a base voltage to their final voltage. Incremental changes in voltage generally cause less disturbance than large changes. Any noise caused by voltage changes in the embodiment of FIG. 10B tends to be less than would be caused by ramping the voltage on word line WLn from a base voltage to Vpgm for example. In some embodiments, programming is achieved by repeatedly applying pulses of programming voltage to a selected word line and verifying the threshold voltage of the underlying floating gate transistors between pulses. Thus, subsequent to t11, the threshold voltages of cells under WLn may be read and subsequently another pulse of program voltage may be applied in the same manner, by applying boosting voltages in a stair-like voltage ramping sequence. Pulsing and reading may be repeated in turn until the threshold voltages of all cells of word line WLn are in their desired states.

Figure 10C:
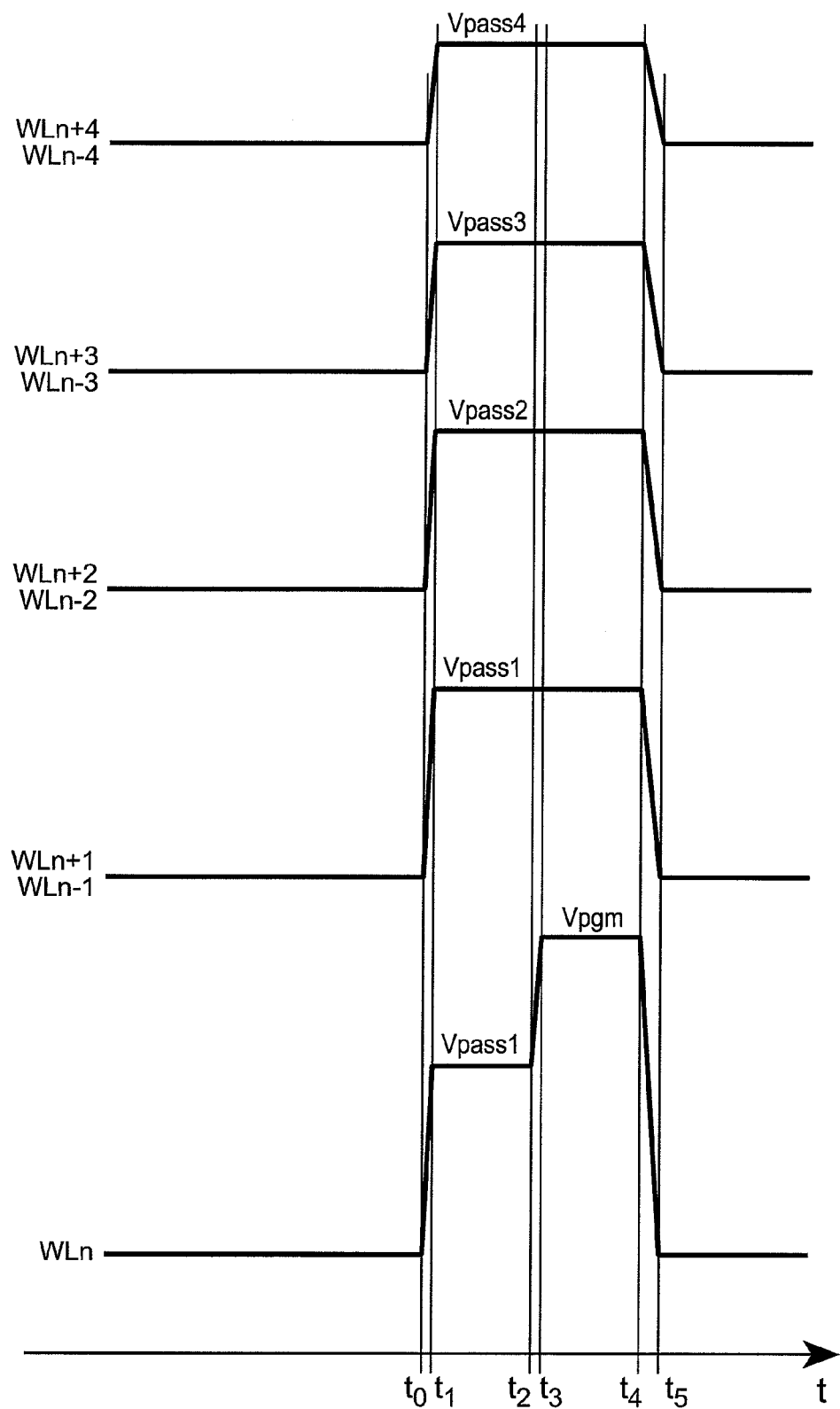
FIG. 10C shows an alternative scheme for achieving the voltage profile of FIG. 10A by ramping voltages on unselected word lines to their target voltages without stepping through intermediate voltages.

FIG. 10C shows a timing diagram of a voltage scheme according to an alternative embodiment. The voltage scheme of FIG. 10C provides a voltage profile that is the same as that shown in FIG. 10A for a period of time from $t_3$ to $t_4$. Thus, the same stair-like pattern of voltages is applied to word lines WLn−4 to WLn+4 during this time. However, during the period prior to $t_3$, voltages are ramped in a different manner to that shown in FIG. 10C. Prior to time $t_0$ word lines WLn−4 to WLn+4 are maintained at a base voltage, for example, zero volts. At time $t_0$, the voltages applied to word lines WLn−4 to WLn+4 are ramped up and at time $t_1$, ramping is stopped and voltages to word lines WLn−4 to WLn+4 are maintained at voltages of Vpass4 (for WLn−4 and WLn+4), Vpass3 (for WLn−3 and WLn+3), Vpass2 (for WLn−2 and WLn+2) and Vpass1 (for WLn−1, WLn and WLn+1). Thus, in this example, voltages supplied to unselected word lines are ramped directly from a base voltage to their desired boosting voltage. While the ramping is shown as taking the same amount of time for all word lines, in some cases, it may take longer for word lines that are raised to higher voltages. Subsequently, at time $t_2$, the voltage on selected word line WLn is ramped and at time $t_3$, ramping ceases and the voltage on WLn is maintained at Vpgm until time $t_4$. While the voltage supplied to the selected word line is ramped and maintained at Vpgm (from time $t_2$ to $t_4$), all unselected word lines remain at their desired boosting voltages (Vpass1 to Vpass4). Subsequently, at time $t_4$, voltages supplied to word lines WLn−4 to WLn+4 are ramped down to the base voltage. This scheme may achieve many of the advantages of a stair-like voltage pattern at time $t_3$ to $t_4$, but because it does not require multiple increases of voltage to unselected word lines, programming may be faster.

The above described boosting voltage schemes may be achieved using appropriate circuits, which are located on the same chip as the memory array as peripheral circuits or on another chip. For example, row control circuits may be adapted to provide a stair-like voltage scheme to unselected word lines and to ramp the voltage to unselected word lines in the manner described above. In some cases, it may also be desirable to use alternate boosting voltage schemes, so a stair-like boosting voltage scheme may be chosen as one mode, where one or more other modes are also available. Another boosting voltage scheme may be a default scheme, so that a stair-like boosting voltage scheme is only chosen if it is enabled. In one example, in the same memory array, different portions of the memory array may use different boosting voltage schemes. For example, different blocks of the memory array might use different boosting voltage schemes. Also, one boosting voltage scheme may be selected at one time and a different boosting voltage scheme may be selected at a later time for a portion of a memory array (or for the entire memory array). A boosting voltage scheme may be chosen during initial testing and configuring of a memory system, before the memory is received by an end user. Alternatively, a suitable boosting voltage scheme may be chosen when the memory is in use, based on certain criteria. These criteria may include wear (the amount of use experienced by all or part of a memory array), frequency of one or more disturbs occurring in the memory array (or a part of the memory array), the nature of the data to be stored (the importance of the data and the probability of repairing the data using ECC or other means), time constraints in programming the data, power constraints in programming the data, the number of logical states stored in a single memory cell, the particular assignment of threshold voltages to memory states and other characteristics of memory arrays. Choosing a suitable boosting voltage scheme may be performed by a controller or by dedicated circuits that may be on the same chip as the memory array.

While the invention has been described above by reference to various embodiments, it will be understood that changes and modifications may be made without departing from the scope of the invention, which is to be defined only by the appended claims and their equivalent. All references referred to herein are incorporated herein by reference.

The invention claimed is:

1. A method of programming an array of floating gate memory cells, comprising:
   applying a programming voltage to a selected word line;
   at the same time, applying a first boosting voltage to a first at least one unselected word line that is immediately adjacent to the selected word line; and
   at the same time, applying a second boosting voltage to a second at least one unselected word line that is immediately adjacent to the first one or more unselected word lines, the first boosting voltage being greater than the second boosting voltage.

2. The method of claim 1 further comprising applying at least one additional boosting voltage to at least one additional word line, the at least one additional boosting voltage being less than the third boosting voltage, the at least one additional word line being immediately adjacent to the third word line.

3. The method of claim 2 wherein the first boosting voltage, second boosting voltage, third boosting voltage and at least one additional boosting voltage have a stair-like voltage profile with voltage descending from the first unselected word line to the at least one additional word line in successive increments.

4. The method of claim 1 further comprising applying a first isolating voltage to a first isolating word line, the first isolating voltage causing at least one memory cell under the first isolating word line to be turned off.

5. The method of claim 4 wherein the first isolating word line lies between the selected word line and at least one row of previously programmed floating gate memory cells.

6. The method of claim 4 further comprising applying a second isolating voltage to a second isolating word line, the second isolating voltage causing at least one memory cell under the second isolating word line to be turned off.

7. The method of claim 6 wherein the first and second isolating voltages are zero volts.

8. A method of programming a floating gate memory array having word lines overlying strings of floating gate cells, comprising:
   applying a programming voltage to a selected one of a plurality of word lines of a block;
   at the same time, applying a first boosting voltage to a first unselected one of the plurality of word lines that is immediately adjacent to the selected one of the plurality of word lines; and
   at the same time, applying a second boosting voltage to a second unselected one of the plurality of word lines, the first boosting voltage being greater than the second boosting voltage, the first and the second boosting voltages turning on floating gate cells of the first and second ones of the plurality of word lines, the first unselected one of the plurality of word lines lying between the selected one of the plurality of word lines and the second unselected one of the plurality of word lines, the selected one and the second unselected one of the plurality of word lines having no isolating word lines between them.

9. A method of programming an array of floating gate memory cells, comprising:
   applying a first boosting voltage to a selected word line, a first unselected word line and a second unselected word line at a first time;
   subsequently, at a second time, maintaining the first boosting voltage to the first unselected word line;
   at the second time, incrementing the second unselected word line and the selected word line to a second boosting voltage that is higher than the first boosting voltage;
   subsequently, at a third time, maintaining the first boosting voltage to the first unselected word line and maintaining the second boosting voltage to the second word line; and
   at the third time, applying a programming voltage to the selected word line.

10. The method of claim 9 wherein the second unselected word line is adjacent to the selected word line and the first unselected word line is adjacent to the second unselected word line.

11. The method of claim 9 further comprising applying a third boosting voltage to the selected word line, the first unselected word line, the second unselected word line and a third unselected word line at a third time that is prior to the first time, the third boosting voltage being less than the first boosting voltage.

* * * * *